(12) United States Patent
Kanegae et al.

(10) Patent No.: US 8,687,024 B2
(45) Date of Patent: Apr. 1, 2014

(54) PIXEL CIRCUIT AND DISPLAY APPARATUS

(75) Inventors: Arinobu Kanegae, Osaka (JP); Shinya Ono, Osaka (JP); Mika Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 207 days.

(21) Appl. No.: 12/719,438

(22) Filed: Mar. 8, 2010

(65) Prior Publication Data

US 2010/0220118 A1    Sep. 2, 2010

Related U.S. Application Data

(63) Continuation of application No. PCT/JP2008/002689, filed on Sep. 26, 2008.

(30) Foreign Application Priority Data

Sep. 28, 2007  (JP) ................................. 2007-253335

(51) Int. Cl.
  *G09G 5/10*  (2006.01)
(52) U.S. Cl.
  USPC ................. 345/690; 345/63; 345/77; 345/89; 345/204; 315/169.3; 313/463
(58) Field of Classification Search
  USPC .................... 345/82, 690, 76–77, 89, 204, 63; 315/169.3; 313/463
  See application file for complete search history.

(56) References Cited

U.S. PATENT DOCUMENTS

| 5,923,309 | A | 7/1999 | Ishizuka et al. | |
|---|---|---|---|---|
| 7,317,434 | B2 | 1/2008 | Lan et al. | |
| 2004/0233147 | A1* | 11/2004 | Kawachi et al. | 345/82 |
| 2005/0007357 | A1 | 1/2005 | Yamashita et al. | |
| 2005/0248593 | A1* | 11/2005 | Feng et al. | 345/690 |
| 2006/0119548 | A1* | 6/2006 | Lan et al. | 345/76 |
| 2007/0013620 | A1* | 1/2007 | Tanahashi et al. | 345/82 |
| 2007/0040770 | A1* | 2/2007 | Kim | 345/76 |

FOREIGN PATENT DOCUMENTS

| JP | 09-305146 | 11/1997 |
|---|---|---|
| JP | 2000-267597 | 9/2000 |
| JP | 2002-278513 | 9/2002 |
| JP | 2003-140570 | 5/2003 |
| JP | 2003-216102 | 7/2003 |
| JP | 2003-224437 | 8/2003 |

(Continued)

OTHER PUBLICATIONS

Japan Office Action, mailed Aug. 7, 2012, for corresponding Japanese Patent Application.

*Primary Examiner* — Srilakshmi K Kumar
*Assistant Examiner* — Insa Sadio
(74) *Attorney, Agent, or Firm* — Greenblum & Bernstein, P.L.C.

(57) ABSTRACT

An active matrix display apparatus comprises plural gate lines and plural source lines that are arranged such that the plural gate lines respectively intersect the plural source lines and light-emitting element circuits, which are provided to respectively correspond to intersections at which the plural gate lines intersect the plural source line. Additionally, each of the light-emitting element circuits includes a light-emitting element for emitting light according to a current supplied thereto, a drive transistor for controlling a current supplied to the light-emitting element, and a control transistor for controlling writing of an image signal to the drive transistor. Furthermore, the drive transistor has a body terminal and is configured to correct luminance of the light-emitting element using a voltage applied to the body terminal.

5 Claims, 7 Drawing Sheets

(56) References Cited

FOREIGN PATENT DOCUMENTS

| JP | 2004-341444 | 12/2004 |
| JP | 2005-004183 | 1/2005 |
| JP | 2005-069565 | 3/2005 |
| JP | 2005-215609 | 8/2005 |
| JP | 2009-69571 | 4/2009 |
| WO | 2006/060519 | 6/2006 |

\* cited by examiner

PIXEL CIRCUIT AND DISPLAY APPARATUS

This is a continuation application under 35 U.S.C. 111(a) of pending prior International application No. PCT/JP2008/002689, filed on Sep. 26, 2008.

TECHNICAL FIELD

The present invention relates to a light-emitting element circuit including a self-luminous element such as an organic electroluminescence (EL) element, and an active matrix display apparatus including the light-emitting element circuit.

BACKGROUND ART

In recent years, FPDs (Flat Panel Displays) have been drawing an increasing attention, in place of CRTs (Cathode Ray Tubes). As typical FPDs, a LCD (Liquid Crystal Display) and a PDP (Plasma Display Panel) have been already put into practice. However, it is pointed out that these FPDs have drawbacks explained below.

Since the LCD does not emit light for itself, a high-luminance backlight is required. As a result, electric power consumption tends to increase. The LCD is inferior to the CRT in viewing angle and response speed. On the other hand, the PDP uses a self-luminous element and has a capability which is equal to or higher than that of the CRT in viewing angle and response speed. However, since a high voltage is required to drive the PDP, it is difficult to achieve low electric power consumption in the PDP.

Although the LCD and the PDP have the above mentioned problems, an organic EL device has a potential to solve these problems. For this reason, a display apparatus including the organic EL device has attracted an attention as a candidate of a next-generation FPD.

The organic EL device is typically manufactured in the following method. Initially, an anode is formed over a support substrate such as a cleaned glass, quartz, or plastic, and then is patterned. Typically, as the anode, ITO (Indium Tin Oxide) having a high work function is selected, but other metals may be used. To form the anode, a sputtering process is typically used.

After forming the anode as described above, an organic EL layer (light-emitting layer) is formed. Typically, in a case of a low-molecular organic EL, the organic EL layer is formed by a vacuum evaporation process, while in a case of a polymer organic EL, the organic EL layer is formed by a spin coating process or an ink jet process. The ink jet process is selected when it is necessary to coat different organic EL layers side by side.

To improve a light-emitting efficiency before and after forming the organic EL layer, an interlayer and a hole-injection layer are sometimes formed.

After forming the organic EL layer, a cathode is formed by vacuum evaporation or the like and sealed, thereby completing the organic EL device.

When the organic EL device manufactured as described above is applied to the display apparatus, the organic EL devices are typically arranged in matrix. An apparatus for driving the organic ELs by thin film transistors (TFTs) formed along with the organic EL devices is called an active matrix drive display apparatus, while an apparatus for driving the organic ELs only by electrodes without forming the TFTs is called a passive matrix drive display apparatus.

The active matrix drive has advantages and others that cross talk is extremely less because switching is performed by the TFT provided for each pixel and its life is extended because it is not necessary to emit light with high luminance unlike passive matrix drive. On the other hand, the active matrix drive has a drawback that luminance unevenness occurs due to variations in a threshold and mobility of TFT, etc. For this reason, to implement favorable image display, it is necessary to perform luminance unevenness compensation (initial luminance compensation).

To perform the initial luminance compensation, there is an internal compensation method for compensating for luminance unevenness by performing voltage programming using a programming circuit including the TFT (see, e.g., Patent document 1) and an external compensation method for performing compensation by allowing external memory of a panel to have luminance data (see, e.g., Patent document 2).

In addition to the problem associated with the initial luminance compensation, a problem that a property of the TFT and a property of the organic EL degrade with time will arise. The organic EL device is a DC-drive device. With an increase in a drive time, the property of the TFT and the property of the organic EL degrade, thereby causing luminance unevenness. To solve this, compensation for luminance unevenness (time-lapse luminance compensation) is performed by feeding back a current flowing through the organic EL (see Patent document 3).

Patent document 1: Japanese Laid-Open Patent Application Publication No. 2004-341444
Patent document 2: Japanese Laid-Open Patent Application Publication No. Hei. 9-305146
Patent document 3: Japanese Laid-Open Patent Application Publication No. 2002-278513

DISCLOSURE OF THE INVENTION

Problem to be Solved by the Invention

However, in the conventional driving method and display apparatus described above, the following problems exist. In the internal compensation method which is represented by voltage programming and current programming for implementing the initial luminance compensation, since the TFTs and wires required for the respective pixels significantly increase in number, a yield decreases, In the external compensation method, data bits used for luminance compensation are required in addition to data bits used for display, thereby increasing a cost of a source driver for outputting data.

Also, in the case of the time-lapse luminance compensation, data bits used for luminance compensation are required as in the above external compensation method, and therefore, a cost of a source driver increases.

When the organic EL is fabricated using a printing means which is represented by ink jet, the film thickness tends to be uneven in a direction in which printing progresses and thereby the luminance unevenness of a line shape tends to occur.

The present invention has been developed under the circumstances, and an object of the present invention is to provide a light-emitting element circuit for achieving luminance compensation easily without significantly increasing the number of TFTs provided in respective pixels without using an expensive source driver, and an active matrix display apparatus including the light-emitting element circuit.

Another object of the present invention is to provide a light-emitting element circuit and an active matrix display apparatus which are capable of compensating for luminance unevenness resulting from printing easily and inexpensively.

Means for Solving the Problem

To solve the above described problem, a light-emitting element circuit of the present invention which is provided to correspond to each of intersections at which plural gate lines respectively intersect plural source lines, comprises a light-emitting element for emitting light according to a current supplied thereto; a drive transistor for controlling a current supplied to the light-emitting element; and a control transistor for controlling an ON/OFF operation of the drive transistor; wherein the drive transistor has a body terminal and is configured to correct luminance of the light-emitting element using a voltage applied to the body terminal.

Since the drive transistor has the body terminal and performs the luminance compensation for the light-emitting element using the voltage applied to the body terminal, luminance unevenness can be compensated for with a simple configuration.

An active matrix display apparatus of the present invention, comprises plural gate lines and plural source lines which are arranged such that the plural gate lines respectively intersect the plural source lines and light-emitting element circuits which are provided to respectively correspond to intersections at which the plural gate lines intersect the plural source lines, respectively; wherein each of the light-emitting element circuits includes a light-emitting element for emitting light according to a current supplied thereto; a drive transistor for controlling a current supplied to the light-emitting element; and a control transistor for controlling an ON/OFF operation of the drive transistor; wherein the drive transistor has a body terminal and is configured to correct luminance of the light-emitting element using a voltage applied to the body terminal.

In the active matrix display apparatus of the present invention, body terminals of drive transistors included in plural light-emitting element circuits which are arranged in a column direction or in a row direction may be connected to a common line.

In the active matrix display apparatus of the present invention, body terminals of drive transistors included in plural light-emitting element circuits which are arranged in matrix may be connected to a common line.

The active matrix display apparatus of the present invention may be configured such that the voltage is applied to the body terminal of the drive transistor according to a degradation state of the light-emitting element included in the light-emitting element circuit. In this case, it is preferable that the degradation state of the light-emitting element is detected based on luminance of the light-emitting element, a current flowing through the light-emitting element, and/or potentials generated at both ends of the light-emitting element.

The above object, other objects, features, and advantages of the present invention will be apparent by the following detailed description of preferred embodiment of the inventions, with reference to the accompanying drawings.

Effects of the Invention

In accordance with the present invention, it is possible to compensate for luminance unevenness of a light-emitting element such as an organic EL element, without increasing the number of TFTs, increasing a cost of a source driver, etc.

DESCRIPTION OF REFERENCE NUMERALS 1 display apparatus
101 control transistor
102 drive transistor
103 organic EL element
104 capacitor element
105 voltage application line
106 gate line
107 source line
110 active matrix substrate
120 head
121 nozzle
130 active matrix substrate
201 control transistor
202, 203 transistors
204 drive transistor
205 organic EL element
206, 207 capacitor element
212 gate driver
213 source driver
214 unevenness correction driver
301 gate terminal
302 source terminal
303 drain terminal
304 body terminal
305 semiconductor layer

BEST MODE FOR CARRYING OUT THE INVENTION

Hereinafter, preferred embodiments of the present invention will be described with reference to the drawings.

(Embodiment 1)

[Configuration of Display Apparatus]

Figure 1:
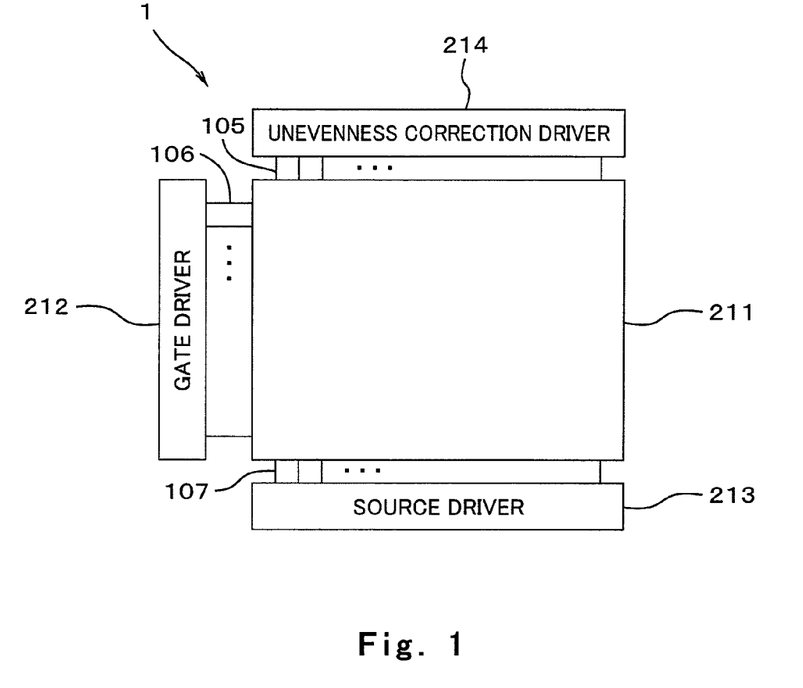
FIG. 1 is a block diagram showing a configuration of an active matrix display apparatus according to Embodiment 1 of the present invention.

FIG. 1 is a block diagram showing a configuration of an active matrix display apparatus (hereinafter simply referred to as "display apparatus") according to Embodiment 1 of the present invention. As shown in FIG. 1, a display apparatus 1 includes an EL display panel 211, a gate driver 212 for driving the EL display panel 211, a source driver 213 for driving the EL display panel 211, and an unevenness correction driver 214 for driving the EL display panel 211.

The EL display panel 211 is an active matrix drive organic EL display device. Gate lines 106 and source lines 107 are arranged on the EL display panel 211 such that the gate lines 106 alternately intersect the source lines 107. Light-emitting element circuits which will be described later are arranged so as to respectively correspond to intersections of the gate lines 106 and the source lines 107. In other words, plural light-emitting element circuits are arranged in matrix.

The gate lines 106 and the source lines 107 are driven by a gate driver 212 and a source driver 213, respectively.

The light-emitting element circuits include drive transistors having body terminals, respectively, as described above. The body terminals are connected to voltage application lines 105 used for correcting unevenness, respectively. The voltage application lines 105 are connected to the unevenness correction driver 214 and are driven by the unevenness correction driver 214.

[Configuration of Light-Emitting Element Circuit]

Subsequently, a configuration of the light-emitting element circuits arranged in matrix as described above will be described.

Figure 2:
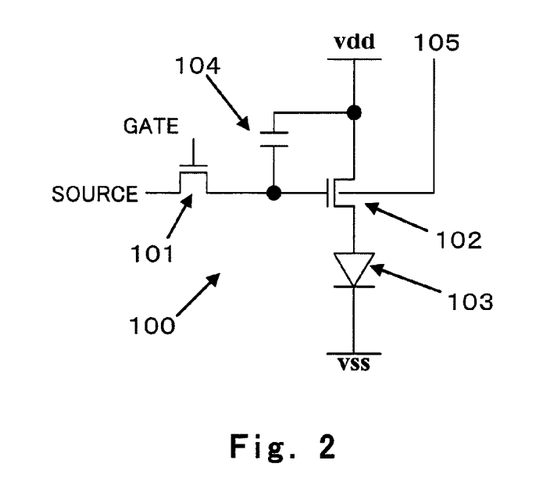
FIG. 2 is a circuit diagram showing an exemplary configuration of a light-emitting element circuit included in the display apparatus according to Embodiment 1 of the present invention.

FIG. 2 is a circuit diagram showing an exemplary configuration of a light-emitting element circuit included in the display apparatus 1 according to Embodiment 1 of the present invention. As shown in FIG. 2, a light-emitting element circuit 100 includes an organic EL element 103 which is a light-emitting element having a diode property, a drive transistor 102 which is connected to the anode of the organic EL element 103 and configured to control a current supplied to the organic EL element 103, and a control transistor 101 for controlling an ON/OFF operation of the drive transistor 102.

The control transistor 101 is a transistor having three terminals. The gate terminal of the control transistor 101 is connected to the above mentioned gate line and the source terminal thereof is connected to the above mentioned source line. The drain terminal of the control transistor 101 is connected to the gate terminal of the drive transistor 102.

The drive transistor 102 is a transistor having four terminals. The gate terminal of the drive transistor 102 is connected to the source terminal of the control transistor 101 as described above, the source terminal thereof is connected to an electric power supply line vdd, the drain terminal thereof is connected to the anode of the light-emitting element 103, and the body terminal thereof is connected to the voltage application line 105.

The light-emitting element circuit 100 includes a capacitor element 104 between the control transistor 101 and the drive transistor 102. The capacitor element 104 is not necessarily provided, but may be provided as desired in design. It is sufficient that the capacitor element 104 retains a voltage between the drain of the control transistor 101 and the gate of the drive transistor 102, and therefore may be provided between the drive transistor 102 and the electric power supply line vdd.

Figure 3:
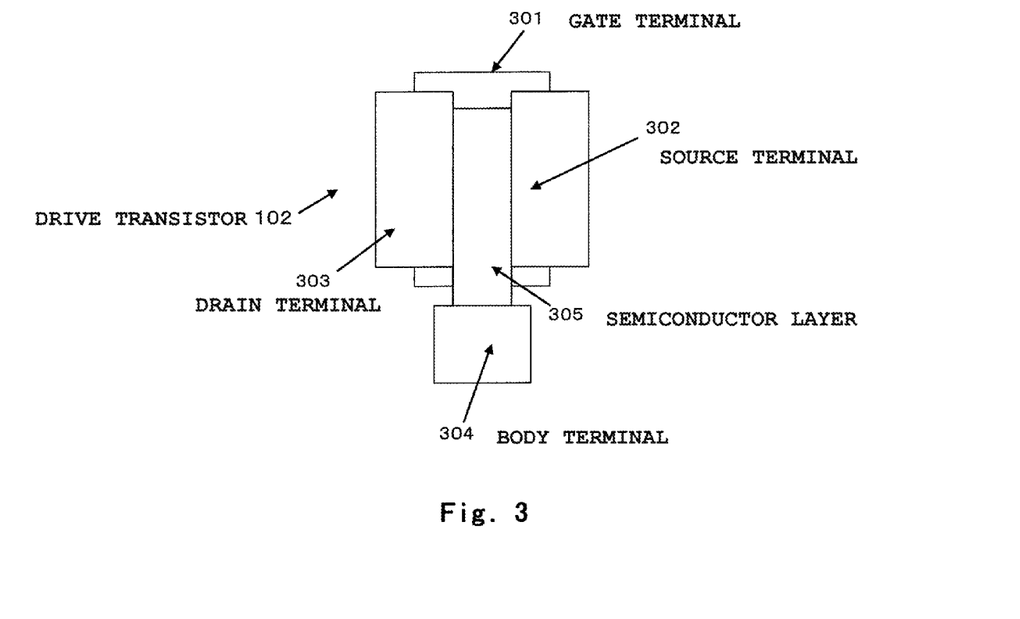
FIG. 3 is a plan view showing an exemplary layout of a drive transistor.

FIG. 3 is a plan view showing an exemplary layout of the drive transistor 102. As described above, the drive transistor 102 includes a semiconductor layer 305, and a gate terminal 301, source and drain terminals 302 and 303 and the body terminal 304 which are connected to the semiconductor layer 305. A bottom gate structure in which the semiconductor layer 305 is formed of amorphous silicon is shown here. Since the body terminal 304 is formed by the same layer as the source and drain, a new process is not required to fabricate the four-terminal transistor.

This layout may be used without being altered so long as the drive transistor 102 has a similar bottom gate structure, if the semiconductor layer 305 is made of microcrystalline silicon, etc, in place of amorphous silicon.

As should be appreciated from the above, the four-terminal transistor may be transistors other than the amorphous silicon transistor and may be formed of microcrystalline silicon, nanocrystalline silicon, organic materials, oxide compounds, nanomaterials such as carbon nano tube and others, as well as polysilicon or single-crystalline silicon. In other words, the four-terminal transistor may be formed of any materials so long as they enable transistor operation. In some cases, a transistor having a top gate structure which is not shown is desirable as the transistor, rather than the bottom gate structure described in this Embodiment. In either case, a new process for forming the four-terminal transistor is not required.

The semiconductor layer of the control transistor 101 may also be formed of microcrystalline silicon, nanocrystalline silicon, organic materials, oxide compounds, nanomaterials such as carbon nano tube and others, as well as amorphous silicon, polysilicon and single-crystalline silicon which are generally used.

In this Embodiment, the control transistor 101 and the drive transistor 102 are each constituted by a P-channel transistor in which holes are carriers. The control transistor 101 and the drive transistor 102 are not limited to this but may be N-channel transistor in which electrons are carriers.

As should be appreciated from the above, both of the P-channel transistor and the N-channel transistor may be used. Nonetheless, in view of the manufacturing process, it is desirable to use one of the P-channel transistor and the N-channel transistor rather than using both of them, in terms of a manufacturing cost, a takt time, yield, etc.

[Operation of Display Apparatus]

In the display apparatus 1 configured as described above, a control circuit which is not shown generates an image signal to be output to the source driver 213, based on an image signal input from an external apparatus. The control circuit outputs the image signal so generated to the source driver 213 and a control signal to the gate driver 212 and to the source driver 213. As a result, the gate driver 212 outputs to the gate lines 106 a scan signal corresponding to a voltage for turning ON the control transistors 101 included in the respective light-emitting element circuits 100, thereby sequentially turning ON the control transistors 101 of the respective light-emitting element circuits 100. According to the timings, the source driver 213 writes the image signal to the respective light-emitting element circuits 100 through the source lines 107. As a result, the drive transistors 102 in the respective light-emitting element circuits 100 operate, causing a current corresponding to the image signal to flow through the organic EL elements 103. Thereby, the organic EL elements 103 in the respective light-emitting element circuits 100 emit light. As a result, an image corresponding to the image signal is displayed on the EL display panel 211.

In the above mentioned operation of the display apparatus, the unevenness correction driver 214 drives the voltage application lines 105, causing the voltage to be applied properly to the body terminals of the drive transistors 102 in the respective light-emitting element circuits 100. This makes it possible to adjust luminance of the light-emitting elements 103. As a result, luminance unevenness compensation is accomplished. Hereinafter, this principle will be described.

Figure 4:
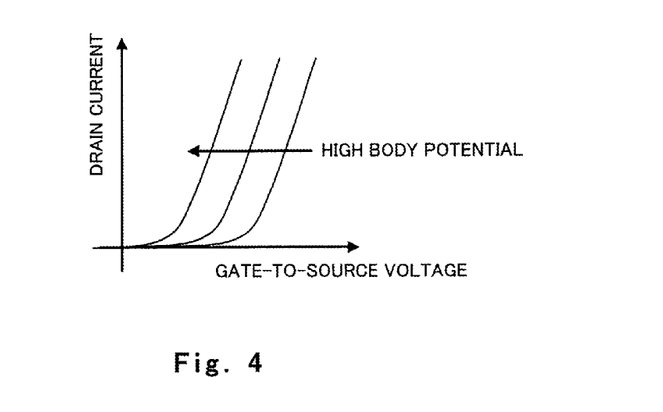
FIG. 4 is a graph showing a relationship between a gate-to-source drain current and a body potential in a four-terminal drive transistor.

FIG. 4 is a graph showing a relationship between a gate-to-source drain current and a body potential in the four-terminal drive transistor 102. In other words, FIG. 4 shows how the drain current changes as the body potential changes.

As shown in FIG. 4, when the body potential is increased (arrow direction in FIG. 4), a threshold voltage of the drive transistor 102 decreases (substrate bias effect). It has been confirmed that a similar effect is produced when the transistor is a thin film transistor (TFT).

FIG. 4 illustrates an exemplary relationship of the N-type transistor in which electrons are carriers.

Thus, by adjusting the body potential, the threshold voltage of the drive transistor 102 can be adjusted. Therefore, as described above, by applying the voltage to the body terminal of the drive transistor 102 by the unevenness correction driver 214, the luminance of the light-emitting element 103 can be adjusted.

As described above, in the light-emitting element circuit of this Embodiment and the display apparatus including the light-emitting element circuit, luminance compensation is achieved with a simple configuration without significantly increasing the number of TFTs and without using an expensive source driver.

(Embodiment 2)

Figure 5:
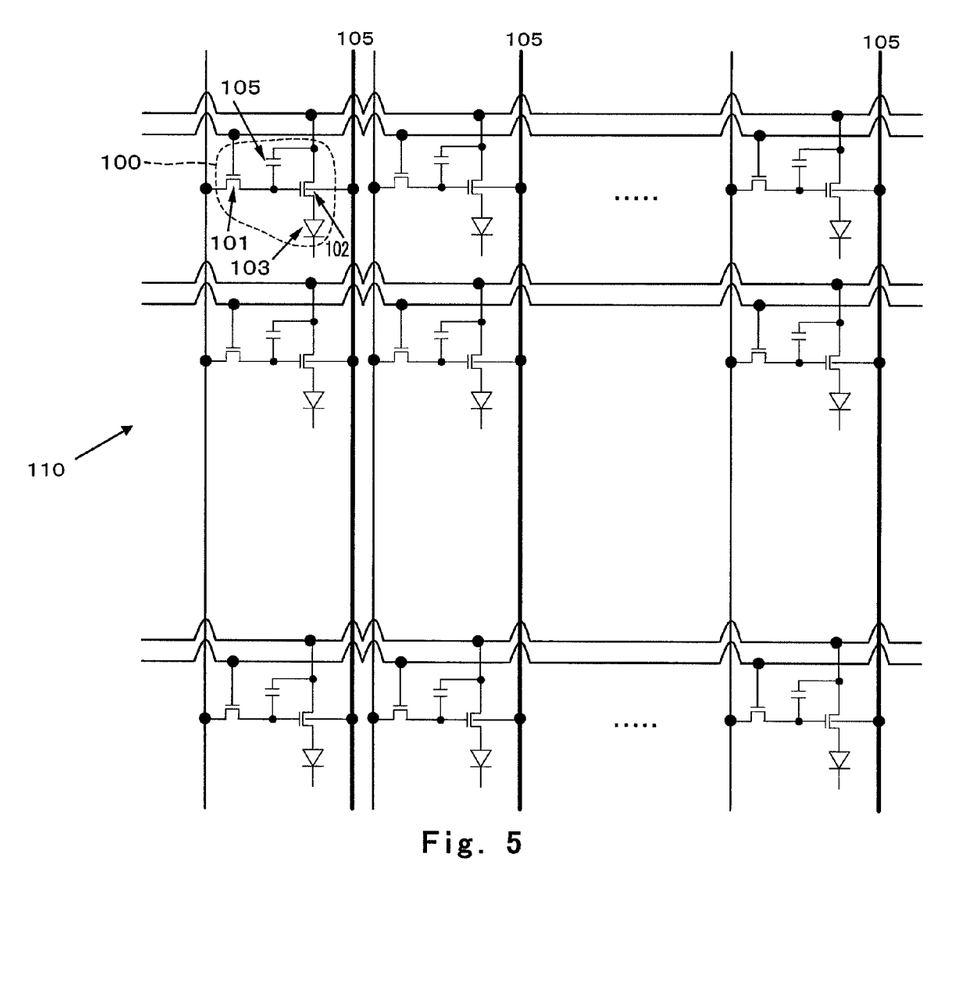
FIG. 5 is a circuit diagram showing a configuration of an active matrix substrate included in a display apparatus according to Embodiment 2 of the present invention.

FIG. 5 is a circuit diagram showing a configuration of an active matrix substrate included in a display apparatus according to Embodiment 2 of the present invention. As shown in FIG. 5, an active matrix substrate 110 is configured such that light-emitting element circuits 100 described in Embodiment 1 are arranged in matrix and the body terminals of the light-emitting element circuits 100 are connected to a common voltage application line 105 in a column direction.

In the above configuration in which the body terminals of the light-emitting element circuits 100 are connected to the common voltage application line 105 in the column direction, the luminance unevenness of the plural light-emitting element circuits 100 arranged in the column direction can be compensated for all together by applying the voltage using the luminance unevenness correction driver.

This configuration is effective in a case where the light-emitting elements are formed by conducting printing in the column direction from the upper part to the lower part (or from the lower part to the upper part) of the active matrix substrate 110.

Figure 6:
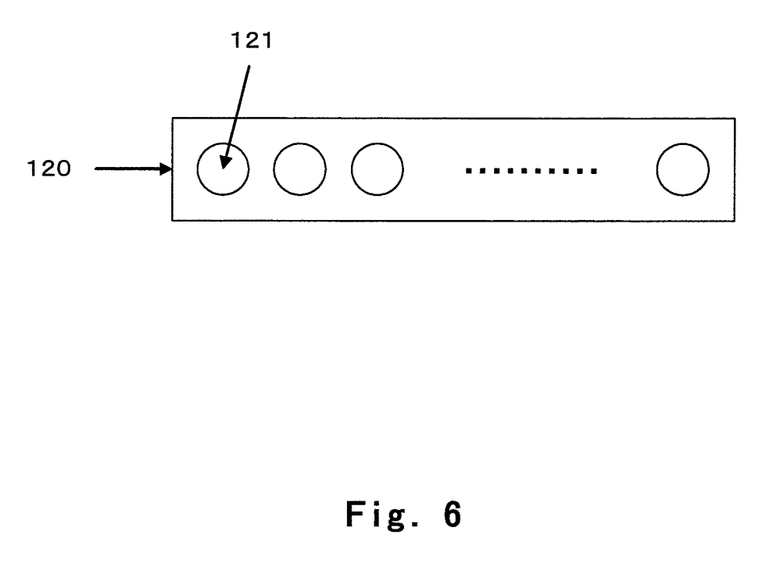
FIG. 6 is a view schematically showing a configuration of a head of an ink jet apparatus which is a printing apparatus.

FIG. 6 is a view schematically showing a configuration of a head of an ink jet apparatus which is a printing apparatus. As shown in FIG. 6, plural nozzles (ink ejecting holes) are formed in array on a head 120. Each of plural sub-pixels composing one pixel is formed by using one nozzle 121. When using the head 120, the light-emitting elements of the plural sub-pixels arranged in a row direction can be formed all together. Therefore, by moving the head 120 in the column direction from the upper part to the lower part (or from the lower part to the upper part) of the active matrix substrate 110, the light-emitting elements are formed over the entire surface of the active matrix substrate 110.

In general, when the light-emitting elements are formed by the above described printing, the film thickness of the light-emitting layers formed by the respective nozzles varies due to a difference between the nozzles, in many occasions. As a result, the luminance of the light-emitting elements formed on the active matrix substrate 110 varies from column line to column line, thereby causing line-shaped unevenness in the column direction. In such a case, since the voltage is applied to the body terminals connected to the common voltage application line in the column direction, for each column line, as shown in FIG. 5, the line-shaped unevenness can be eliminated. It should be noted that the voltage is required to be always applied to the body terminals during a period when the light-emitting elements are emitting light.

Although in this Embodiment, the body terminals of the drive transistors 102 of the light-emitting element circuits 100 are connected to the common voltage application line in the column direction, they may alternatively be connected to a common voltage application line in the row direction, of course. This configuration is effective in a case where the light-emitting elements are formed over the entire surface of the active matrix substrate 110 by moving the head capable of forming the light-emitting elements of the plural sub-pixels arranged in the column direction all together, in the row direction from the left part to the right part (or from the right part to the left part) of the active matrix substrate 110. In other words, it may be determined whether the body terminals are connected to the common voltage application line in the column direction or in the row direction, depending on the printing direction (depending on the direction in which film thickness variation tends to occur) in the case where the light-emitting elements are formed.

(Embodiment 3)

Figure 7:
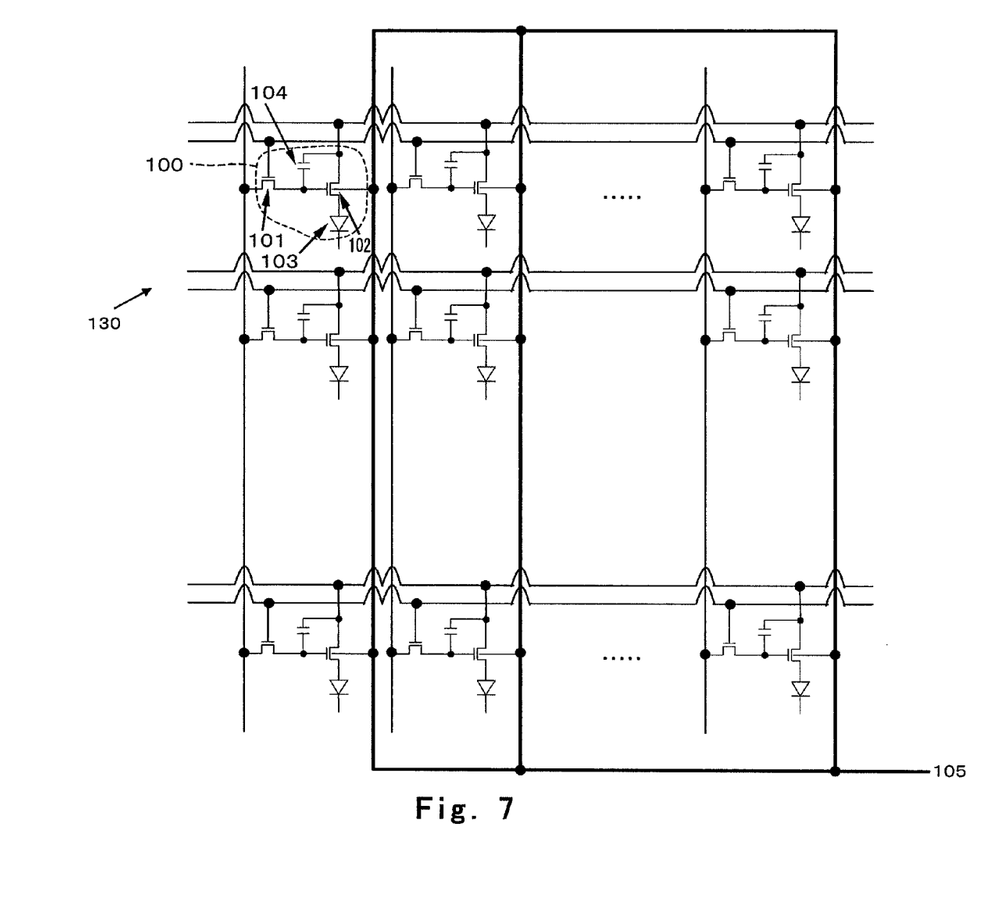
FIG. 7 is a circuit diagram showing a configuration of an active matrix substrate included in a display apparatus according to Embodiment 3 of the present invention.

FIG. 7 is a circuit diagram showing a configuration of an active matrix substrate included in a display apparatus according to Embodiment 3 of the present invention. As shown in FIG. 7, an active matrix substrate 130 is configured such that light-emitting element circuits 100 described in Embodiment 1 are arranged in matrix and the body terminals of the light-emitting element circuits 100 are all connected to a common voltage application line 105.

In the above configuration in which the body terminals of the light-emitting element circuits 100 are all connected to the common voltage application line 105, the luminance unevenness of all of the light-emitting element circuits 100 can be compensated for all together by applying the voltage using the luminance unevenness correction driver.

This configuration is effective, for example, in a case where it is necessary to perform luminance compensation for the entire display apparatus, because of the degradation of the light-emitting elements from their initial states. To detect the degradation of the light-emitting elements, the luminance of the light-emitting element, a current flowing through the light-emitting element, and/or potentials generated at both ends of the light-emitting elements may be detected and the detected values may be compared to predetermined thresholds.

Alternatively, in this Embodiment, general light-emitting element circuits other than the light-emitting element circuit 100 may be used. To be specific, a voltage programming circuit, a current programming circuit, etc, may be used. It should be noted that at least a transistor (generally referred to as a drive transistor) for driving the light-emitting element is required to have a four-terminal configuration.

(Embodiment 4)

Figure 8:
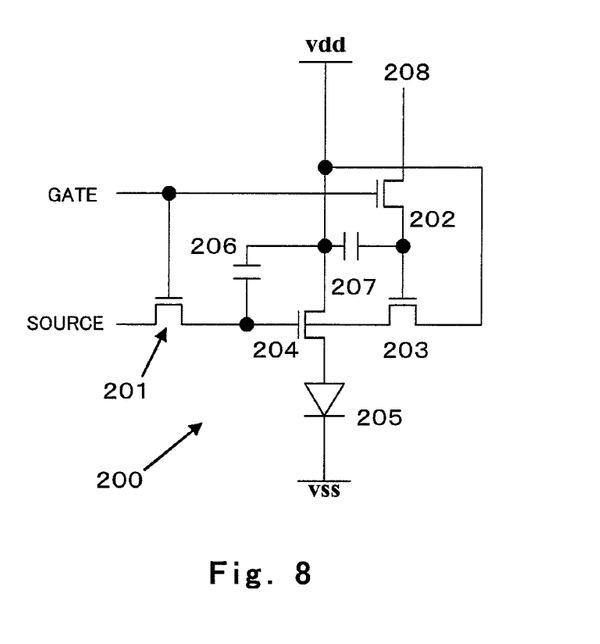
FIG. 8 is a view showing a configuration of a light-emitting element circuit according to Embodiment 4 of the present invention.

FIG. 8 is a view showing a configuration of a light-emitting element circuit according to Embodiment 4 of the present invention. As shown in FIG. 8, a light-emitting element circuit 200 includes an organic EL element 205 which is a light-emitting element having a diode property, a drive transistor 204 which is connected to an anode of the organic EL element 205 and configured to drive the organic EL element 205, and a control transistor 201 for controlling the operation of the drive transistor 204.

The light-emitting element circuit 200 further includes a transistor 203 connected to the body terminal of the drive transistor 204, and a transistor 202 for controlling the operation of the transistor 203.

The control transistor 201 is a three-terminal transistor. The gate terminal of the control transistor 201 is connected to the gate line, the source terminal thereof is connected to the source line, and the drain terminal thereof is connected to the gate terminal of the drive transistor 204.

The drive transistor 204 is a four-terminal transistor. The gate terminal of the drive transistor 204 is connected to the source terminal of the control transistor 201 as described above, the source terminal thereof is connected to the electric power supply line vdd, the drain terminal thereof is connected to the anode of the light-emitting element 205, and the body terminal thereof is connected to the transistor 203 as described above.

The transistor 202 is a three-terminal transistor. The gate terminal of the transistor 202 is connected to the gate line, the source terminal 208 thereof is connected to an unevenness correction driver which is not shown, and the drain terminal thereof is connected to the gate terminal of the transistor 203.

The transistor 203 is a four-terminal transistor. The gate terminal of the transistor 203 is connected to the source terminal of the transistor 202 as described above, the source terminal thereof is connected to the electric power supply line vdd, and the drain terminal thereof is connected to the body terminal of the drive transistor 204.

As shown in FIG. 8, the light-emitting element circuit 200 includes a capacitor element 206 between the control transistor 201 and the drive transistor 204, and a capacitor element 207 between the transistor 202 and the transistor 203. The capacitor elements 206 and 207 are not necessarily provided, as in the case of Embodiment 1.

In the light-emitting element circuit 200 configured as described above, the luminance of the light-emitting element 205 can be adjusted by applying the voltage to the terminal 208 using the unevenness correction driver.

Figure 9:
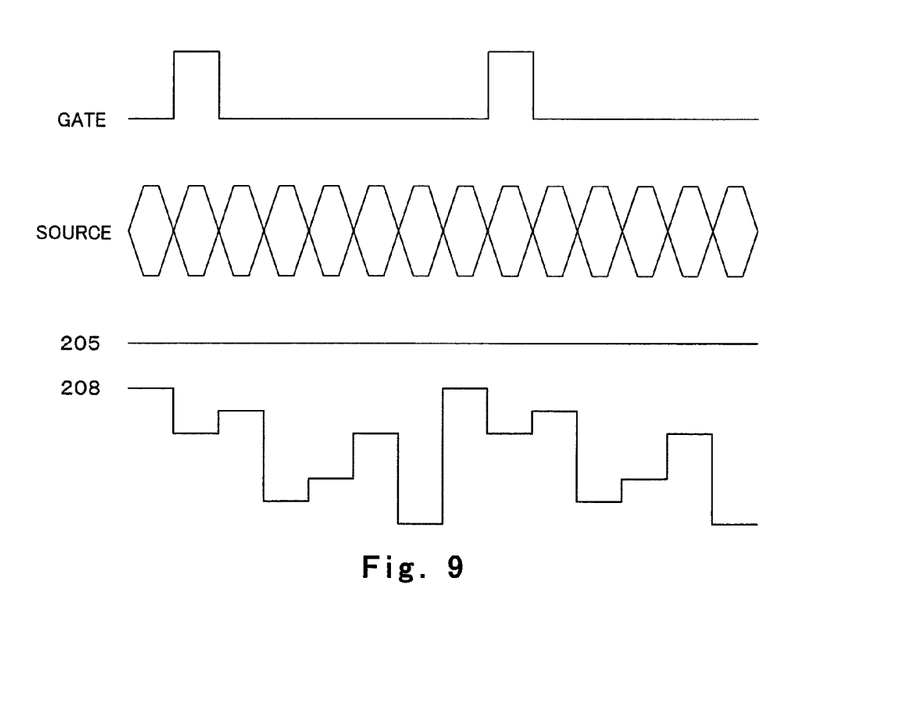
FIG. 9 is a timing chart showing an exemplary operation of the light-emitting element circuit according to Embodiment 4 of the present invention.

FIG. 9 is a timing chart showing an exemplary operation of the light-emitting element circuit according to Embodiment 4 of the present invention. As shown in FIG. 9, a voltage for correcting the luminance unevenness is input from the unevenness correction driver to the terminal 208. When a gate signal is input to the gate line and the control transistor 201 is turned ON (when a data voltage is written to the drive transistor 204), the transistor 202 is turned ON at the same time. As a result, a threshold voltage of the drive transistor 204 for driving the light-emitting element 205 is changed by the above described substrate bias effect, and a current for eliminating the luminance unevenness flows through the light-emitting element 205. When the control transistor 201 and the transistor 202 are turned OFF, the potential of the terminal 208 is retained in the capacitor element 207. Thus, it is possible to correct the unevenness of the respective pixels.

(Embodiment 5)

In Embodiment 5 of the present invention, a configuration for performing unevenness compensation in the unevenness correction driver 214 in Embodiment 2 will be described.

In general, in a manufacturing process of the EL display panel 211, the light-emitting elements are lit for conducting display to determine whether or not the display (EL display panel 211) is good in an inspection step after the light-emitting elements are fabricated. In this Embodiment, when the light-emitting elements are lit for conducting display to determine whether or not the display is good in the inspection step, the luminance of each pixel (luminance of light-emitting element) which is emitting light is measured by using a luminance meter. When compensation for the luminance unevenness resulting from the printing is exclusively performed, it is not necessary to measure the luminances of all of the pixels, because the luminance unevenness occurs in the direction perpendicular to the printing direction. Accordingly, in this Embodiment, compensation for the luminance unevenness resulting from the printing is exclusively performed, and the luminances of all of the pixels arranged in the direction perpendicular to the printing direction are measured in the direction perpendicular to the printing direction. This is essential. In addition to this, the luminances of several pixels arranged along the printing direction are measured in the printing direction, in order to compensate for a difference between pixels in the printing direction. In other words, the luminances of (several pixels along the printing direction)×(all pixels in the direction perpendicular to the printing direction) are measured. If the number of pixels to be measured along the printing direction is increased, then compensation accuracy is correspondingly improved, but an inspection time increases. In view of this trade-off, the number of pixels to be measured is determined.

Then, based on the measured luminance data, the voltage (hereinafter referred to as a compensation voltage) to be applied to the body terminals of the drive transistors 102 in the light-emitting element circuits 100 belonging to each voltage application line 105 is calculated for each voltage application line 105. The compensation voltage is a voltage for flowing a drain current with which each drive transistor 102 causes the associated light-emitting element 103 to emit light with a predetermined luminance. The calculated compensation voltage is written (stored) into a memory (not shown) built into the unevenness correction driver 214. In the operation of the display apparatus 1, the unevenness correction driver 214 applies the associated compensation voltage to each voltage application line 105, with reference to the compensation voltage written in the memory. Thus, the compensation voltage is applied to the body terminals of the drive transistors 102 in the light-emitting element circuits 100 belonging to each voltage application line 105, thereby enabling compensation for the luminance unevenness.

EXAMPLE

To verify the advantage of the present invention, an example of the present invention will be described. This example is an embodied example of Embodiment 3 the present invention.

In this example, the active matrix substrate 130 having the configuration of FIG. 7 was fabricated. In the active matrix substrate 130, pixels of (16 rows×16 columns) are arranged. In other words, 16 light-emitting element circuits 100 are arranged in the row direction and 16 light-emitting element circuits 100 are arranged in the column direction. Each light-emitting element 100 has the configuration shown in FIG. 2. The control transistor 101 and the drive transistor 102 are each constituted by a N-channel amorphous silicon TFT. The light-emitting element 103 is constituted by an organic EL element. All of the source lines are interconnected. All of the gate lines are interconnected. The body terminals of the drive transistors 101 in all of the light-emitting element circuits 100 are connected to a common voltage application line 105 as described in Embodiment 3.

A voltage of +30V was applied to the gate line, a voltage of +10V was applied to the source line, a voltage of +20V was applied to the electric power supply line vvd, and a voltage of 0V was applied to the electric power supply terminal vss. Also, a voltage ranging from −10V to +20V was applied to the voltage application line 105.

From evaluation of a single TFT in advance, it is found that the control transistor 101 is placed into an electrically-conductive state on application of a gate-to-source voltage of +20V to the control transistor 101. Therefore, a voltage of +10V is applied to the gate terminal of the drive transistor 102, a voltage of +20V is applied to the drain terminal of the drive transistor 102, and the voltage applied between the both ends of the light-emitting element 103 is applied to the source terminal of the drive transistor 102. Thereby, a current flowing through the drive transistor 102 is determined, and hence a current flowing through the light-emitting element 103 is determined. In general, the luminance of the light emitted from the light-emitting element 103 is proportional to the current flowing through the light-emitting element 103.

Figure 10:
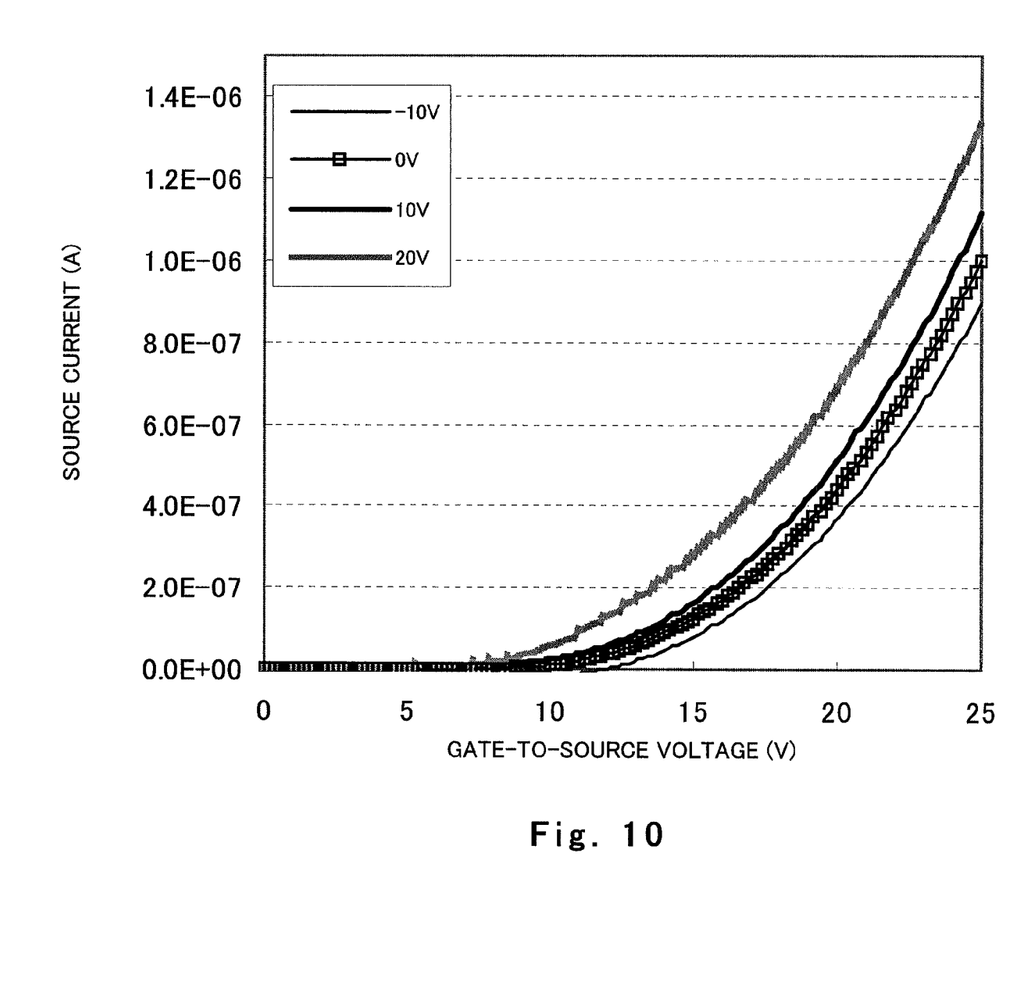
FIG. 10 is a graph showing a source current versus gate-to-source voltage characteristic of a drive transistor.

FIG. 10 is a graph showing a source current versus gate-to-source voltage characteristic of the drive transistor 102. Four curves indicate source current versus gate-to-source voltage characteristic curves in a case where the voltages applied to the body terminal (voltage application line 105) are set to −10V, 0V, +10V and +20V, respectively. As the voltage applied to the body terminal is increased from −10V, the threshold of the drive transistor 102 increases in+direction. As a result, a current flowing through the drive transistor 102 increases. Thus, by changing the voltage applied to the body terminal, the current flowing through the drive transistor 102, and hence the current flowing through the light-emitting element 103 changes, thereby changing the luminance of the EL display panel 211 (see FIG. 1). In this example, luminance was able to be changed about twice. In this manner, it was verified that the luminance unevenness can be compensated for by the present invention.

Although in the above described Embodiments, the organic EL elements are illustrated as the light-emitting elements included in the light-emitting element circuits, the present invention is not limited to this. Other elements may be used so long as they are self-luminous elements. As such a light-emitting element, for example, there are an inorganic EL element, a light-emitting diode (LED), etc.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

Industrial Applicability

A light-emitting element circuit and an active matrix display apparatus of the present invention are capable of easily compensating for luminance unevenness and is useful as various displays for computers and home appliances.

The invention claimed is:

1. An active matrix display apparatus, comprising:
plural gate lines and plural source lines which are arranged such that the plural gate lines respectively intersect the plural source lines;
light-emitting element circuits which are provided to respectively correspond to intersections at which the plural gate lines intersect the plural source lines, respectively; and
an unevenness correction driver for applying a voltage for correcting unevenness of luminance emitted from selected light-emitting elements such that the luminance emitted from each light-emitting element is substantially the same,
wherein each of the light-emitting element circuits includes:
a light-emitting element for emitting light according to a current supplied thereto;
a drive transistor for controlling a current supplied to the light-emitting element according to an image signal; and
a control transistor for controlling writing of the image signal to the drive transistor through the source line, according to a scan signal input to the control transistor through the gate line; and
wherein the drive transistor has a body terminal,
the body terminal of the drive transistor is connected to the unevenness correction driver,
the drive transistor is configured to correct luminance of the light-emitting element using the voltage for correcting unevenness which is applied to the body terminal by the unevenness correction driver, and
the voltage for correcting unevenness is applied to the body terminal of the drive transistor according to film thickness variation of light-emitting layers of the light-emitting element included in the light-emitting element circuit.

2. The active matrix display apparatus according to claim 1,
wherein body terminals of drive transistors included in plural light-emitting element circuits which are arranged in a column direction or in a row direction are connected to a common line and connected to the unevenness correction driver.

3. The active matrix display apparatus according to claim 1,
wherein body terminals of drive transistors included in plural light-emitting element circuits which are arranged in matrix are connected to a common line and connected to the unevenness correction driver.

4. The active matrix display apparatus according to claim 1, wherein the light-emitting layers are formed by printing.

5. The active matrix display apparatus according to claim 1, wherein the light-emitting element is an organic EL element.

* * * * *